(12) United States Patent
Akram et al.

(10) Patent No.: US 10,002,941 B2
(45) Date of Patent: Jun. 19, 2018

(54) HYBRID GATE DIELECTRICS FOR SEMICONDUCTOR POWER DEVICES

(71) Applicant: FAIRCHILD SEMICONDUCTOR CORPORATION, Sunnyvale, CA (US)

(72) Inventors: Salman Akram, Boise, ID (US); Venkat Ananthan, Cupertino, CA (US)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 0 days. days.

(21) Appl. No.: 15/158,214

(22) Filed: May 18, 2016

(65) Prior Publication Data

US 2016/0343823 A1 Nov. 24, 2016

Related U.S. Application Data

(60) Provisional application No. 62/164,252, filed on May 20, 2015.

(51) Int. Cl.
| | |
|---|---|
| *H01L 29/15* | (2006.01) |
| *H01L 29/51* | (2006.01) |
| *H01L 29/16* | (2006.01) |
| *H01L 29/66* | (2006.01) |
| *H01L 21/04* | (2006.01) |

(Continued)

(52) U.S. Cl.
CPC .......... *H01L 29/513* (2013.01); *H01L 21/049* (2013.01); *H01L 29/1608* (2013.01); *H01L 29/66068* (2013.01); *H01L 29/7802* (2013.01); *H01L 29/7813* (2013.01); *H01L 29/7395* (2013.01); *H01L 29/7397* (2013.01)

(58) Field of Classification Search
CPC ............. H01L 29/516; H01L 29/41775; H01L 29/42364
See application file for complete search history.

(56) References Cited

U.S. PATENT DOCUMENTS

| | | |
|---|---|---|
| 2010/0013009 A1 | 1/2010 | Pan et al. |
| 2011/0254010 A1 | 10/2011 | Zhang |
| 2012/0080749 A1 | 4/2012 | Purtell et al. |

(Continued)

OTHER PUBLICATIONS

Gupta, et al., "Materials and Processing for Gate Dielectrics on Silicon Carbide (SiC) Surface", Physics and Techology of Silicon Carbide Devices, 2013, 28 pages.

(Continued)

*Primary Examiner* — Dale E Page
*Assistant Examiner* — Wasiul Haider
(74) *Attorney, Agent, or Firm* — Brake Hughes Bellermann LLP

(57) ABSTRACT

In a general aspect, a power semiconductor device can include a silicon carbide (SiC) substrate and a SiC epi-layer disposed on the SiC substrate. The device can also include a first well region, a second well region disposed in the SiC epi-layer, a first source region disposed in the first well region, and a second source region disposed in the second well region. The device can further include a gate structure disposed on the SiC epi-layer and extending between the first source region and the second source region. The gate structure can include a hybrid gate dielectric. The hybrid gate dielectric can include a first high-k dielectric material and a second high-k dielectric material. The device can also include a conductive gate electrode disposed on the hybrid gate dielectric.

24 Claims, 8 Drawing Sheets

(51) Int. Cl.
*H01L 29/78* (2006.01)
*H01L 29/739* (2006.01)

(56) References Cited

U.S. PATENT DOCUMENTS

| | | |
|---|---|---|
| 2013/0175630 A1 | 7/2013 | Ando et al. |
| 2014/0138708 A1 | 5/2014 | Mitani et al. |
| 2015/0303299 A1* | 10/2015 | Chang ................ H01L 29/7827 257/29 |
| 2016/0141371 A1* | 5/2016 | Tega ................... H01L 21/0465 257/77 |
| 2017/0092743 A1* | 3/2017 | Okumura .......... H01L 29/66734 |

OTHER PUBLICATIONS

Usman, et al., "Characterization of Al-based high-k stacked dielectric layers deposited on 4H-SiC by Atomic Layer Deposition", Materials Science Forum, vols. 679-680, pp. 441-444, Mar. 28, 2011.
International Search Report and Written Opinion for International Application PCT/US2016/033203, dated Aug. 8, 2016, 13 pages.

* cited by examiner

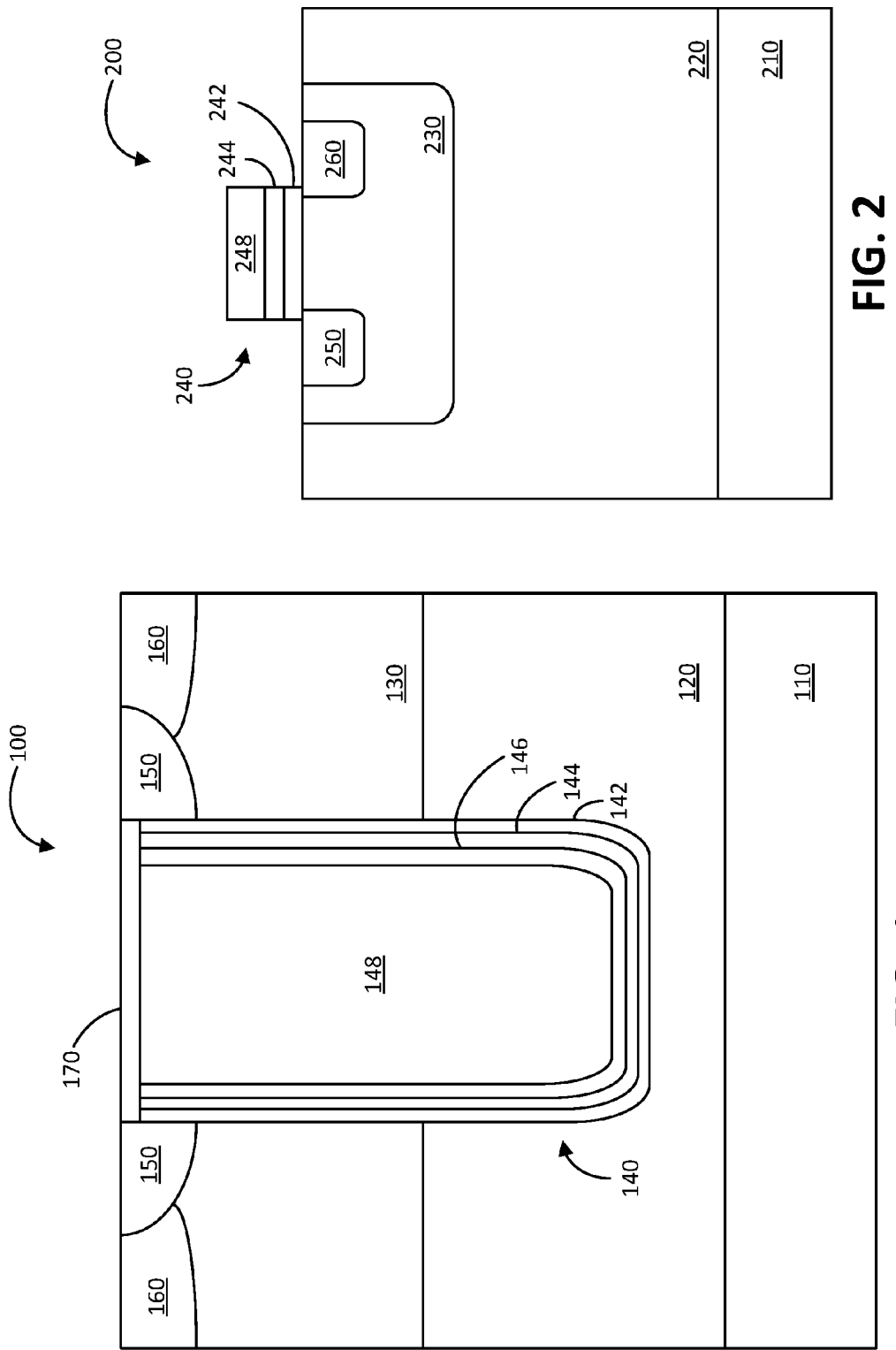

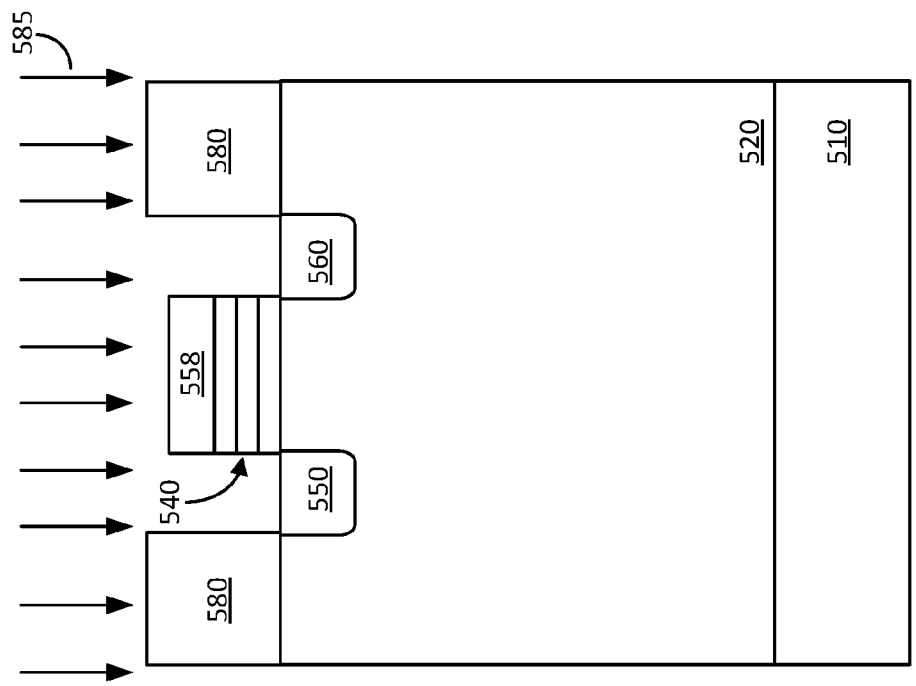
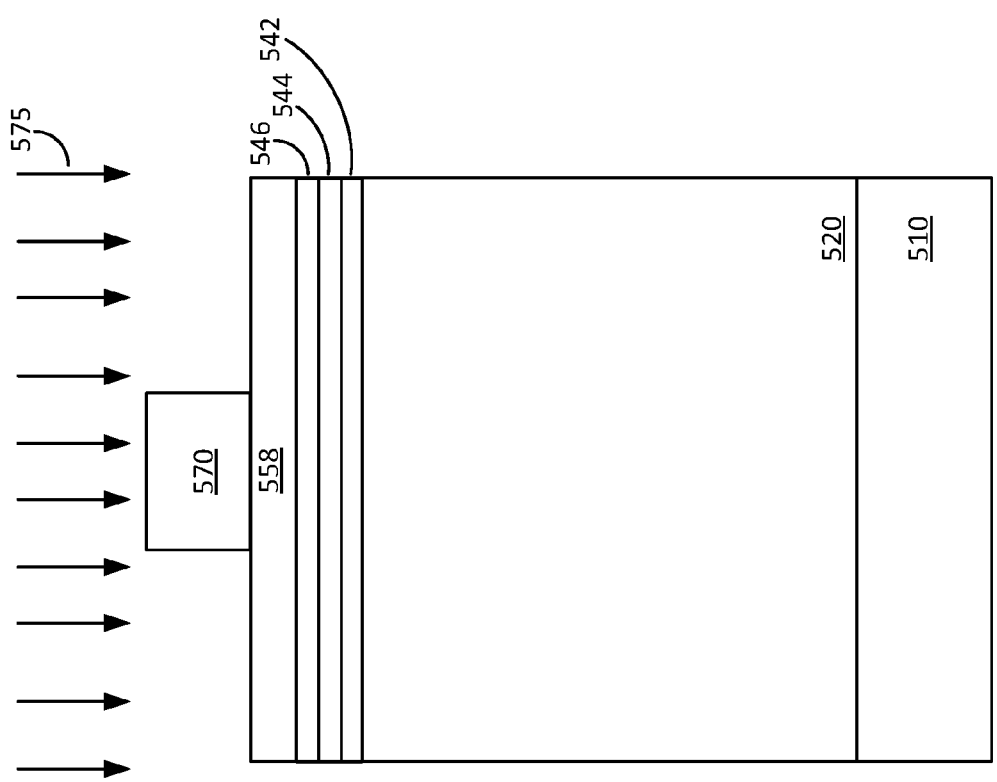

HYBRID GATE DIELECTRICS FOR SEMICONDUCTOR POWER DEVICES

CROSS-REFERENCE TO RELATED APPLICATIONS

This application claims priority to and the benefit of U.S. Provisional Application No. 62/164,252, filed May 20, 2015, entitled "Hybrid High-K Gate Dielectrics For Semiconductor Power Devices", the contents of which is hereby incorporated by reference in its entirety.

TECHNICAL FIELD

This description relates to power semiconductor devices. In particular, this description relates to power semiconductor devices, e.g., implemented in a silicon carbide substrate, with hybrid, high-k gate dielectrics.

SUMMARY

In a general aspect, a power semiconductor device can include a silicon carbide (SiC) substrate of a first conductivity type and a SiC epitaxial layer of the first conductivity type disposed on the SiC substrate. The SiC epitaxial layer can have a doping concentration that is different than a doping concentration of the SiC substrate. The power semiconductor device can also include a well region of a second conductivity type disposed in the SiC epitaxial layer, a source region of the first conductivity type disposed in the well region and a gate trench disposed in the SiC epitaxial layer and adjacent to the source region. The gate trench can have a depth that is greater than a depth of the well region and that is less than a depth of the SiC epitaxial layer. The power semiconductor device can further include a hybrid gate dielectric disposed on a sidewall of the gate trench and a bottom surface of the gate trench. The hybrid gate dielectric can include a first high-k dielectric material and a second high-k dielectric material that is different than the first high-k dielectric material. The power semiconductor device can still further include a conductive gate electrode disposed on the hybrid gate dielectric.

Implementations can include one or more of the following features. For example, the first high-k dielectric material can be included in a first layer of the hybrid gate dielectric that is disposed on the sidewall of the gate trench and the bottom surface of the gate trench. The second high-k dielectric material can be included in a second layer of the hybrid gate dielectric that is disposed on the first layer of the hybrid gate dielectric.

The hybrid gate dielectric can include an interface dielectric layer disposed between at least a portion of the gate trench and the first high-k dielectric material. The interface dielectric layer can include a thermally grown silicon dioxide ($SiO_2$) layer.

The hybrid gate dielectric can include a composite of the first high-k dielectric material and the second high-k dielectric material. Respective concentrations of the first high-k dielectric material and the second high-k dielectric material can vary across a thickness of the hybrid gate dielectric.

The hybrid gate dielectric can include a third high-k dielectric material. The first high-k dielectric material can be included in a first layer of the hybrid gate dielectric that is disposed on the sidewall of the gate trench and the bottom surface of the gate trench. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The first high-k dielectric material and the third high-k dielectric material can be a same high-k dielectric material.

The hybrid gate dielectric can include a third high-k dielectric material, where the hybrid gate dielectric includes a composite of the first high-k dielectric material, the second high-k dielectric material and the third high-k dielectric material. Respective concentrations of the first high-k dielectric material, the second high-k dielectric material and the third high-k dielectric material can vary across a thickness of the hybrid gate dielectric.

The conductive gate electrode can include at least one of doped polysilicon, a metal and a silicide. The power semiconductor device can include a dielectric cap disposed on the conductive gate electrode.

The power semiconductor device can include a heavy body region of the second conductivity type disposed in the well region and adjacent to the source region. The heavy body region can have a doping concentration that is greater than a doping concentration of the well region.

In another general aspect, a power semiconductor device can include a silicon carbide (SiC) substrate of a first conductivity type and a SiC epitaxial layer of the first conductivity type disposed on the SiC substrate. The SiC epitaxial layer can have a doping concentration that is different than a doping concentration of the SiC substrate. The power semiconductor device can also include a well region of a second conductivity type disposed in the SiC epitaxial layer, a source region of the first conductivity type disposed in the well region, a drain region of the first conductivity type disposed in the well region and a gate structure disposed on the SiC epitaxial layer. The gate structure can extend between the source region and the drain region. The gate structure can be disposed on a portion of the source region and a portion of the drain region. The gate structure can include a hybrid gate dielectric disposed on the SiC epitaxial layer. The hybrid gate dielectric can include a first high-k dielectric material and a second high-k dielectric material. The gate structure can further include a conductive gate electrode disposed on the hybrid gate dielectric.

Implementations can include one or more of the following features. For instance, the first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The hybrid gate dielectric can include a composite of the first high-k dielectric material and the second high-k dielectric material.

The hybrid gate dielectric can include a third high-k dielectric material. The first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The hybrid gate dielectric can include a composite of the first high-k dielectric material, the second high-k dielectric material and the third high-k dielectric material.

In another general aspect, a power semiconductor device can include a silicon carbide (SiC) substrate of a first conductivity type. The SiC substrate can include a drain region of the power semiconductor device. The power semiconductor device can also include a SiC epitaxial layer of the first conductivity type disposed on the SiC substrate. The SiC epitaxial layer can have a doping concentration that is different than a doping concentration of the SiC substrate. The power semiconductor device can further include a first well region of a second conductivity type disposed in the SiC epitaxial layer and a second well region of the second conductivity type disposed in the SiC epitaxial layer. The power semiconductor device can also further include a first source region of the first conductivity type disposed in the first well region and a second source region of the first conductivity type disposed in the second well region. The power semiconductor device can still further include a gate structure disposed on the SiC epitaxial layer. The gate structure can extend between the first source region and the second region. The gate structure can be disposed on a portion of the first source region and a portion of the first source region. The gate structure can include a hybrid gate dielectric disposed on the SiC epitaxial layer. The hybrid gate dielectric can further include a first high-k dielectric material and a second high-k dielectric material. The gate structure can still further include a conductive gate electrode disposed on the hybrid gate dielectric.

Implementations can include one or more of the following features. For instance, the first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The hybrid gate dielectric can include a composite of the first high-k dielectric material and the second high-k dielectric material.

The hybrid gate dielectric can include a third high-k dielectric material. The first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The hybrid gate dielectric can include a composite of the first high-k dielectric material, the second high-k dielectric material and the third high-k dielectric material.

BRIEF DESCRIPTION OF THE DRAWINGS

FIG. 1 is a cross-sectional diagram illustrating a silicon carbide (SiC) trench gate field effect transistor (FET) with a hybrid, high-k gate dielectric, according to an implementation.

FIG. 2 is a cross-section diagram illustrating a lateral SiC planar gate FET with a hybrid, high-k gate dielectric, according to an implementation.

FIGS. 5A-5H are cross-sectional diagrams illustrating a semiconductor manufacturing process for producing a SiC FET with a hybrid gate dielectric, such as the SiC FET shown in FIG. 2, according to an implementation.

DETAILED DESCRIPTION

Figure 3C:
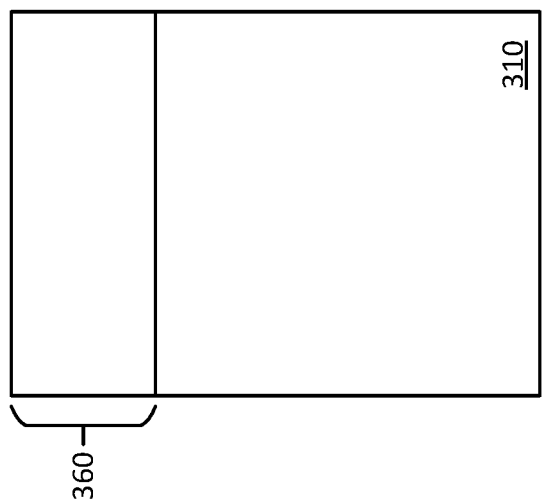
FIGS. 3A-3C are cross-sectional, schematic diagrams illustrating hybrid, high-k gate dielectrics that can be implemented in SiC semiconductor power devices, according to respective implementations.

Power semiconductor devices based on wide bandgap materials including SiC and GaN, such as field effect transistor (FET) power devices, are generally used due, at least in part, to their ability to sustain breakdown voltages higher than conventional silicon power devices. For both Si and SiC devices, a common gate dielectric that is used is silicon dioxide $SiO_2$. However, at the high operating voltages associated with power semiconductor devices (e.g., 200 V, 400 V, 1000 V, etc.) $SiO_2$ gate dielectrics are exposed to high electric fields due to the low dielectric constant of $SiO_2$. These high electric fields can limit the operating voltage that a SiC semiconductor power device can withstand (e.g., an off-state gate to drain voltage in an N-type SiC FET) due to voltage breakdown in the $SiO_2$ gate dielectric. Accordingly, such SiC power devices may not achieve their maximum desired operating voltages (e.g., due to avalanche breakdown).

Dielectric materials with high dielectric constants (high-k dielectrics), such as metal oxides, can be used in place of (or in addition to) $SiO_2$ in order to reduce the electric field in the gate dielectric of such device and achieve improvements in breakdown performance and, accordingly, achieve an increase in the holding (off-state) voltage that a given SiC power device can sustain. Such high-k dielectrics, such as those described herein, can have dielectric constants (k values) in an approximate range of 10 to 100, as compared the dielectric constant of $SiO_2$, with an approximate range of k values of 3.7 to 4.1.

In power semiconductor devices, the voltage rating for a given device may be determined based on the lowest breakdown field of either the substrate material or the gate dielectric material. For power semiconductor devices that are implemented in silicon substrates with $SiO_2$ gate dielectrics, the voltage rating will be based on the breakdown field of the silicon substrate, which is approximately 200-300 kV/cm, as compared to the breakdown field of $SiO_2$, which is approximately 4 MV/cm (effectively infinity compared to the breakdown field for the silicon substrate).

In comparison, for power semiconductor devices implemented in SiC, the breakdown field of SiC is in excess of 3 MV/cm. Additionally, due to continuity of electrostatic displacement field normal to the interface between SiC and a $SiO_2$ gate dielectric, the electric field normal to the interface will be increased in the gate dielectric by a ratio of SiC-to-oxide permittivity, e.g., approximately a factor of 2. Accordingly, if the field in a power semiconductor device implemented in SiC is 3.5 MV/cm, the field in the gate dielectric can be on the order of 7 MV/cm. For $SiO_2$ gate dielectrics, the gate dielectric will breakdown about the same voltage as SiC. However, unlike the case for avalanche breakdown in SiC, breakdown in the $SiO_2$ gate dielectric is irreversible and destructive, resulting in a major reliability concern in SiC devices that is not present in devices implemented in silicon. This reliability concern can be addressed using hybrid gate dielectrics, such as those described herein, which, due to the high-k dielectric materials included in such hybrid gate dielectrics, can have significantly higher breakdown field values than SiC substrate materials (e.g., SiC epitaxial layers).

One consideration associated with the use of high-k dielectrics as gate dielectrics in SiC power devices is the quality of the interface between the high-k dielectric and the SiC substrate (or a SiC epitaxial layer formed on a SiC substrate). For instance, because such high-k dielectrics (e.g., metal oxides) are typically deposited (rather than thermally grown, as with $SiO_2$), depending on the particular high-k dielectric material used and the characteristics of the SiC substrate (or epi-layer), the quality of the interface between the high-k dielectric and the SiC substrate can vary. For purposes of this disclosure, the terms "SiC substrate" and "SiC epi-layer" may be used interchangeably.

The quality of this interface can affect device performance characteristics, such as the gate dielectric breakdown voltage of a given device. For instance, if the interface between a SiC substrate and a given high-k dielectric is of relatively poor quality (e.g., has a high defect density), the breakdown voltage of an associated SiC power device may not be substantially improved over that of a comparable device that includes a thermally grown $SiO_2$ layer as a gate dielectric, because thermally grown $SiO_2$ typically forms a high quality (e.g., has a relatively low defect density) interface with the SiC substrate.

Furthermore, high-k dielectrics that form a high quality interface may not have electrical characteristics (e.g., a sufficiently high dielectric constant) that achieve desired operating characteristics for a corresponding SiC power device. Of course, other considerations regarding material and electrical properties of a particular dielectric material may be considered when selecting a high-k dielectric for use in a particular device and/or semiconductor (e.g., SiC) manufacturing process.

As discussed further below, hybrid, high-k dielectrics can be used as gate dielectrics in SiC power devices in order to, at least in part, overcome the concerns noted above with respect to dielectric to substrate interface quality and achieving desired device operating characteristics. Briefly, such hybrid high-k dielectrics can include bi-layer dielectrics, tri-layer dielectrics and composite dielectrics. The composition of a particular hybrid, high-k gate dielectric can depend on a number of factors, such as a desired holding voltage of a corresponding SiC power device, desired forward and reverse device performance characteristics, and so forth. Further, the particular arrangement (e.g., bi-layer, tri-layer, composite, etc.) and material composition of a given hybrid, high-k gate dielectric can depend on such factors, as well as the particular device in which the hybrid dielectric is implemented.

FIGS. 1 and 2 illustrate example SiC power devices which include hybrid, high-k gate dielectrics, according to two implementations. FIG. 1 illustrates a SiC trench gate field effect transistor (FET) 100 and FIG. 2 illustrates a SiC planar gate, lateral FET 200. The FET 100 and the FET 200 are shown by way of example and for purposes of illustration. The hybrid, high-k dielectrics in FETs 100 and 200 could take other forms (e.g., a hybrid composite high-k dielectric, such as described herein). Further, hybrid, high-k gate dielectrics, such as those described herein, can be used in other SiC power devices such as insulated gate bipolar transistors (IGBTs), superjunction devices, among other SiC power devices including a gate dielectric. Additionally, FETs 100 and 200 may be implemented using other arrangements for the elements of those devices and the particular configurations shown in FIGS. 1 and 2 are given by way of example.

As illustrated in FIG. 1, the FET 100 includes a SiC substrate 110, which can be a heavily doped SiC substrate (e.g., with a doping concentration in a range of 1e18 $cm^{-3}$ to 1e20 $cm^{-3}$). The SiC substrate 110 can be of a first conductivity type. For example, the substrate 110 can be an N-type substrate or a P-type substrate, depending on the particular conductivity type of the FET 100 (e.g., N-channel FET or P-channel FET). For purposes of clarity in the discussion below, the particular conductivity of each of the elements of the FETs 100 and 200 is not specified. The conductivity of those elements will depend on the particular device type being implemented (e.g., N-type or P-type). The conductivity of the elements will instead, for purposes of illustration, be referred to as being of a first conductivity type or a second conductivity type (such as the substrate 110 being of the first conductivity type), where the specific conductivities of each such element will depend on the particular device being implemented.

Referring to FIG. 1, the FET 100 further includes a SiC epi-layer 120 of the first conductivity type disposed on the SiC substrate 110. The epi-layer 120 may have a lower doping concentration than a doping concentration of the SiC substrate 110 (e.g., in a range of 1e14 $cm^{-3}$ to 1e16 $cm^{-3}$). As illustrated in FIG. 1, the FET 100 also includes a well region 130 of a second conductivity type, opposite the first conductivity type, where the well region 130 is disposed in the epi-layer 120 and defines a body region of the FET 100.

The FET 100 further includes a trench gate structure 140, source regions 150 of the first conductivity type, heavy body regions 160 of the second conductivity type and a dielectric cap 170 disposed on (over) the trench gate structure 140. The dielectric cap 170 can electrically insulate the trench gate structure 140 (e.g., the conductive gate electrode 148) from conductive (e.g., metal) layers (not shown in FIG. 1) that can be disposed on the upper surface of the FET 100, such as a metal layer to provide electric (e.g., power supply) connections to the source regions 150 and the heavy body regions 160. The dielectric cap layer 170 can be formed using a number of appropriate materials (e.g., borophosphosilicate glass (BPSG), tetraethyl orthosilicate (TEOS), etc.) and, in other embodiments, can take other forms, such as extending over a portion of the source regions 150. In the devices described herein, it will be appreciated that the source and drain regions can be reversed in a device of an opposite conductivity type (e.g., a p-type FET as compared to an n-type FET).

As shown in FIG. 1, the trench gate structure 140 includes a tri-layer, hybrid, high-k gate dielectric including a first high-k dielectric layer 142, a second high-k dielectric layer 144 and a third high k-dielectric layer 146, where the high-k dielectric layers include materials with dielectric constants in a range of 10 to 100. The trench gate structure 140 also includes a conductive gate electrode 148, which can be formed using doped polysilicon, metal, and/or a number of other appropriate materials. In an embodiment, the first dielectric layer 142 and the third dielectric layer 146 may be formed using a first (same) high-k dielectric material, while the second dielectric layer 144 may be formed using a second high-k dielectric material that is different than the first high-k dielectric material.

In the device 100 of FIG. 1 (and in other devices including a multiple layer, e.g., bi-layer or tri-layer, hybrid, high-k gate dielectric), the first dielectric layer (e.g., the dielectric layer 142); or an additional dielectric layer, or other material layer (not shown) that is disposed below the first dielectric layer 142 can be an interfacial layer that is used to improve the interface quality (e.g., reduce a defect density) between the SiC substrate or SiC epi-layer and deposited high-k dielectric materials, such as the interfacial layers described herein. Such an interfacial layer can be, e.g., a thin $SiO_2$ layer. The interfacial layer can be formed using a number of approaches. In some instances, an interfacial $SiO_2$ can be formed as a result of exposure of the SiC epi-layer 120 to an oxygen containing environment (e.g., air). In other instances, an interfacial $SiO_2$ layer can be a thermally grown dielectric layer. In other implementations, other interfacial dielectric layers can be used. In an implementation, such interfacial dielectric layers can be on the order of 5-20 angstroms (Å) thick (e.g., a few $SiO_2$ monolayers).

In the FET 100 shown in FIG. 1, a tri-layer hybrid, high-k gate dielectric structure 140 may be used for gate dielectric symmetry (e.g., so as to achieve desired forward and reverse device performance characteristics). Further, in such a structure, the high-k dielectric material used for the first dielectric layer 142 (and the third dielectric layer 146) may be selected based on the quality of an interface that is formed between the selected material and the SiC epi layer 120 (and the well region 130) and/or with an interfacial dielectric layer, if present. Further, the high-k dielectric material used for the second dielectric layer 142 may be selected based on its dielectric constant and/or its interface quality with the dielectric material used for the first dielectric layer 142 and the third dielectric layer 146. In other implementations, other factors may be taken into consideration when selecting the dielectric materials for use in the FET 100. Depending on the particular implementation, the materials for the first dielectric layer 142, the second dielectric layer 144 and the third layer 146 can be selected from high-k dielectric materials including aluminum oxide (AlOx), titanium oxide (TiOx), magnesium oxide (MgOx), zirconium oxide (ZrOx), hafnium silicon oxide (HfSiOx) and lanthanum silicon oxide (LaSiOx), or combinations thereof, as well as other possible high-k dielectric materials.

For example, in one implementation, the first dielectric layer 142 and the third dielectric layer 146 can be formed using AlOx, while the second dielectric layer 144 can be formed using TiOx. In another implementation, the first dielectric layer 142 and the third dielectric layer 146 can be formed using TiOx, while the second dielectric layer 144 can be formed using AlOx. In other implementations, different high-k materials could be selected for the layers of the tri-layer, hybrid high-k gate dielectric of the FET 100. In still other implementations, a bi-layer or composite hybrid, high-k gate dielectric (such as those described herein) can be used in the FET 100.

As shown in FIG. 2, the lateral FET 200 includes a SiC substrate 210 (e.g., a heavily doped SiC substrate) of a first conductivity type and a SiC epi-layer 220 of the first conductivity type disposed on the SiC substrate 210, where a doping concentration of the epi-layer 220 may be lower than a doping concentration of the SiC substrate 210. The FET 200 further includes a well region 230 of a second conductivity type (opposite the first conductivity type) disposed in the SiC epi-layer 420, where the well region 230 defines a body region of the FET 200. The FET 200 also includes a planar gate structure 240 and source/drain regions 250 of the first conductivity type disposed in the well region 230.

As shown in FIG. 2, the gate structure 240 includes a bi-layer hybrid, high-k gate dielectric including a first high-k dielectric layer 242 and a second high-k dielectric layer 244. The gate structure 240 also includes a conductive gate electrode 248 that can be formed from a number of appropriate materials including polysilicon (e.g., doped polysilicon), metal, or silicide. In the bi-layer, hybrid, high-k gate dielectric of the gate structure 240, the first gate dielectric layer 242 can, for example, be selected based on its interface properties (quality) with the SiC epi-layer 220 (and the well region 230). In the FET 200, the second gate dielectric layer 244 can be selected, for example, based on its dielectric constant, so as to achieve desired electrical performance characteristics. Further, the dielectric material of the second dielectric layer 244 may also be selected for its interface properties with the dielectric material used for the first dielectric layer 242 and/or its interface properties with the material used to form the gate electrode 248. Such interface properties include defect density, formation of interfacial material and its crystallinity, adhesion, and a bandgap between the dielectric layer 244 and the gate electrode 248. In other implementations, other factors can be considered when selecting the dielectric materials for the dielectric layers 242 and 244.

In an example implementation, the first dielectric layer 242 can be formed using TiOx and the second dielectric layer 244 can be formed using AlOx. In another implementation, the first dielectric layer 242 can be formed using AlOx and the second dielectric layer 244 can be formed using TiOx. In other embodiments, other materials may be used to form the dielectric layers 242 and 244 and the particular materials selected will depend on the particular implementation.

The FET 200 can also include additional elements, such as one or more dielectric layers and one or more conductive material (metal) layers to form electrical contacts with the body region 230, the source 250 and/or the drain 260. These conductive materials can be used to send and receive electrical signals to/from the FET 200. Examples of such layers are shown, for example, in FIG. 5H, which is discussed in further detail below. Electrical connection with the conductive gate electrode 248 can be made in similar fashion, or can be accomplished in other ways, such as by using a gate runner that electrically connects multiple gate segments of a power FET device together.

The gate dielectric structures shown in FIGS. 1 and 2 are shown by way of example, and other approaches are possible. For instance, the FET 100 could include a bi-layer, hybrid, high-k gate dielectric, such as described with respect to FIGS. 2 and 3A, or a composite, hybrid, high-k gate dielectric, such as described with respect to FIG. 3C. Likewise, the FET 200 could include a tri-layer, hybrid, high-k gate dielectric, such as described with respect to FIGS. 1 and 3B, or a composite, hybrid, high-k gate dielectric, such as described with respect to FIG. 3C. Furthermore, the elements of the FET 100 and the FET 200 illustrated in FIGS. 1 and 2 (as well as the gate dielectric structures of FIGS. 3A-3C) are shown for purposes of illustration and may not be shown to scale. Additionally, though not specifically shown in the FETs 100 and 200 (or the gate dielectric structures in FIGS. 3A-3C), as noted above, such hybrid high-k gate dielectric structures may include an interfacial $SiO_2$ layer between the SiC epi-layer (or the SiC substrate) and the hybrid, high-k gate dielectrics. Such an interfacial layer can be a naturally occurring $SiO_2$ layer, or can be, for example, a thermally grown $SiO_2$ layer. Such a $SiO_2$ layer may improve the quality of the interface between the SiC substrate (e.g., epi layer) and a hybrid, high-k gate dielectric.

Figure 3B:
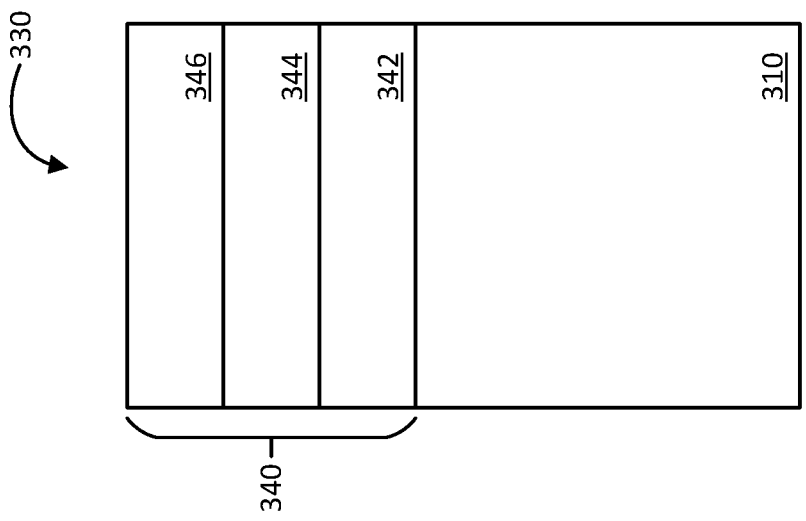
Figure 3A:
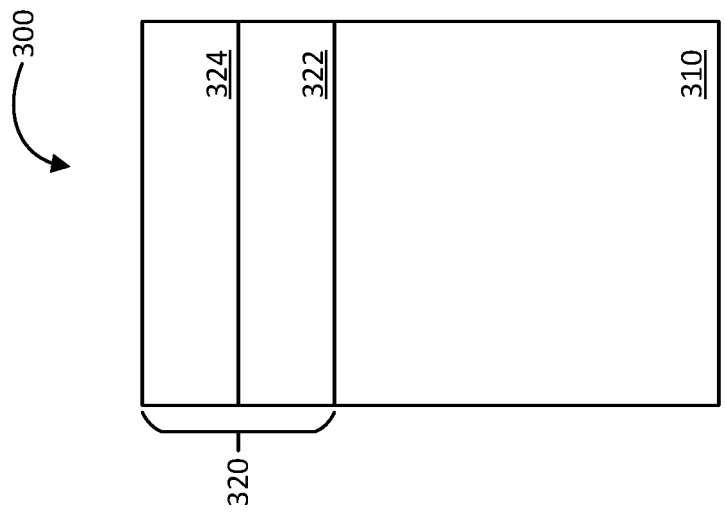

FIGS. 3A, 3B and 3C illustrate example implementations of hybrid, high-k gate dielectric structures 300, 330 and 350 in schematic diagram form. Such hybrid, high-k gate dielectric structures can be used in SiC power devices, such as those described above, or in power devices having other configurations. The gate dielectric structure 300 of FIG. 3A includes a bi-layer gate dielectric, such as was described above with respect to FIG. 2. The gate dielectric structure 330 of FIG. 3B includes a tri-layer gate dielectric, such as described above with respect to FIG. 1. The gate dielectric structure 350 of FIG. 3C includes a composite gate dielectric, which is described further below. Each of the gate dielectrics of the gate dielectric structures 300, 330 and 350 is illustrated as being formed on a SiC substrate 310, which can be a highly doped SiC substrate or a SiC epi-layer having a lower doping concentration.

As shown in FIG. 3A, a bi-layer gate dielectric 320 is formed (e.g., deposited) on the SiC substrate 310, and includes a first dielectric layer 322 and a second dielectric layer 324. As shown in FIG. 3B, a tri-layer gate dielectric 340 is formed on the SiC substrate 310, and includes a first dielectric layer 342, a second dielectric layer 344 and a third dielectric layer 346. Some example high-k dielectrics that can be used in the hybrid (bi-layer and tri-layer), high-k gate dielectrics of FIGS. 3A and 3B, as noted above, are AlOx, TiOx, MgOx, ZrOx, HfSiOx and/or LaSiOx. For instance, the bi-layer gate dielectric 320 and the tri-layer gate dielectric 340 of FIGS. 3A and 3B can include AlOx in combination with TiOx, MgOx in combination with TiOx, AlOx in combination with ZrOx, HfSiOx in combination with LaSiOx, or other appropriate combinations of such materials. In such arrangements, the material used for each dielectric layer can depend on the particular implementation and desired device characteristics.

As indicated above, the gate dielectric structure 350 of FIG. 3C includes a composite, hybrid high-k gate dielectric 360. The composite gate dielectric 360 may include a composite of multiple high-k dielectric materials. For instance, the composite, hybrid high-k gate dielectric 360 can be formed from $Al_xTi_yO_z$, $Mg_xTi_yO_z$ or $Al_xZr_yO_z$, where x and y represent relative stoichiometry of the metal elements in the composite and can vary between 0 and 1 (with their sum being 1). In such composites, z can represent the stoichiometry of oxygen in the composite. Further, the concentrations of the different materials (e.g., metals) can vary across a thickness of the composite gate dielectric 360. For example, in a composite dielectric of $Al_xTi_yO_z$, x may be equal to 1 (and y equal to 0) at the interface between the substrate 310 and the composite dielectric 360. Further, x may be equal to zero (and y equal to 1) at the upper surface of the composite dielectric 360, where x decreases as y increases through a thickness of the gate dielectric structure 350 (e.g., linearly or non-linearly).

In other implementations, the composite gate dielectric 360 can be formed from $Hf_xLa_ySi_zO_m$ (or other combination of materials) where x, y and z represent relative stoichiometry of the metal elements in the composite and can vary between 0 and 1 (with their sum being 1), and m represents the stoichiometry of oxygen in the composite. As discussed above with respect to the $Al_xTi_yO_z$ example, the respective concentrations of Hf, La and Si can vary across the thickness of the composite gate dielectric 360.

Such material compositions for the composite gate dielectric 360 may be achieved, for example, by changing precursor flow rates during deposition of the composite, hybrid high-k gate dielectric 360. As noted above, the composite gate dielectric 360 could be implemented in place of the tri-layer gate dielectric of FIG. 1 or the bi-layer gate dielectric of FIG. 2, or used in other SiC power devices.

Figure 4:
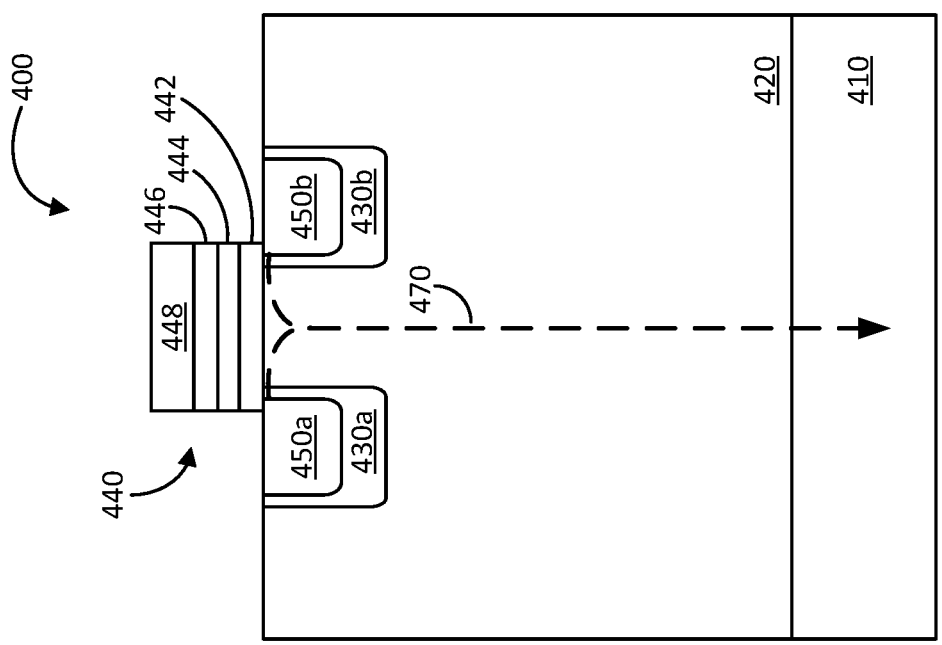
FIG. 4 is a cross-sectional diagram illustrating a vertical SiC FET with a planar gate that includes a hybrid, high-k gate dielectric, according to an implementation.

FIG. 4 is a cross-sectional diagram illustrating a vertical SiC FET 400 with a planar gate structure that includes a hybrid gate dielectric, according to an implementation. As illustrated in FIG. 4, the FET 400 includes a SiC substrate 410 (e.g., a heavily doped SiC substrate) of a first conductivity type and a SiC epi-layer 420 of the first conductivity type disposed on the SiC substrate 410, where a doping concentration of the epi-layer 420 may be lower than a doping concentration of the SiC substrate 410, such as described herein. The FET 400 further includes multiple well regions 430a and 430b of a second conductivity type (opposite the first conductivity type) disposed in the SiC epi-layer 420, where the well regions 430a and 430b define respective body regions of the FET 400. The FET 400 also includes a planar gate structure 440 and source regions 450a and 450b of the first conductivity type, each of the source regions 450a and 450b being respectively disposed in a corresponding one of the well regions 430a and 430b. Accordingly, the FET 400 can operate as two separate FETs that are controlled by a single gate (e.g., the planar gate structure 440).

As shown in FIG. 4, the planar gate structure 440 includes a tri-layer, hybrid, high-k gate dielectric, such as the tri-layer, hybrid gate dielectrics described above with respect to FIGS. 1 and 3B. For instance, the gate structure 440 can include a first high-k dielectric layer 442, a second high-k dielectric layer 444 and a third high-k dielectric layer 446. Also, as previously described with respect to FIG. 1, in some implementations of the FET 400, the first dielectric layer 442 can be an interfacial layer (dielectric layer, or otherwise) such as a thermally grown (and/or naturally occurring) $SiO_2$ layer that is on the order to 5-20 Å thick (e.g., a few monolayers), where the interfacial layers improves the interface quality (e.g., reduces a defect density) of the interface between the SiC epi-layer 420 and the gate dielectric (e.g., as compared to directly depositing a high-k dielectric layer on the SiC epi-layer 420).

The gate structure 440 shown in FIG. 4 also includes a conductive gate electrode 448 that can be formed from a number of appropriate materials including polysilicon (e.g., doped polysilicon), metal, or silicide. In a similar manner as discussed above with respect to FIG. 1, in the tri-layer, hybrid, high-k gate dielectric of the gate structure 440, the high-k dielectric material used for the first dielectric layer 442 (and the third dielectric layer 446) may be selected based on the quality of an interface that is formed between the selected material and the SiC epi layer 420 (and the well regions 430a and 430b) and/or with an interfacial dielectric layer, if present. Further, the high-k dielectric material used for the second dielectric layer 442 may be selected based on its dielectric constant and/or its interface quality with the dielectric material used for the first dielectric layer 442 and the third dielectric layer 446. In other implementations, other factors may be taken into consideration when selecting the dielectric materials for use in the FET 400. Depending on the particular implementation, the materials for the first dielectric layer 442, the second dielectric layer 444 and the third layer 446 can be selected from high-k dielectric materials including those described herein, where the selected materials can be implemented in any number of appropriate arrangements.

The hybrid gate dielectric of FIG. 4 is shown by way of example, and other approaches are possible. For instance, the FET 400 could include a bi-layer, hybrid, high-k gate dielectric, such as described with respect to FIGS. 2 and 3A, or a composite, hybrid, high-k gate dielectric, such as described with respect to FIG. 3C. Furthermore, the elements of the FET 400 are shown for purposes of illustration and may not be shown to scale.

As with the FETs 100 and 200, the FET 400 can also include additional elements (similar to those illustrated in FIG. 5), such as one or more dielectric layers and one or more conductive material (metal) layers that are used to form (define) electrical contacts with the well (body) regions 430a and 430b and the source regions 450a and 450b. In the vertical FET 400 (and the trench gate FET 100), the SiC substrate 410 can act as the drain terminal (e.g., for an n-type device, where the source and drain can be reversed for a p-type device). These conductive materials can be used to send and receive electrical signals to/from the FET 400. Examples of such layers are shown, for example, in FIG. 5H, which is discussed in further detail below. Electrical connection with the conductive gate electrode 448 can be made in similar fashion, or can be accomplished in other ways, such as by using a gate runner that electrically connects multiple gate segments of a power FET device together.

As illustrated in FIG. 4, the dashed arrow 470 indicates a direction of carrier flow in the FET 400 (e.g., for an n-type device) when the FET 400 is in a conducting (on) state. As shown in FIG. 4, carriers flow both laterally (e.g., from the source regions 450a and 450b to the epi-layer 420, through the body regions 430a and 430b) and vertically (e.g., between the SiC epi-layer 420 and the SiC substrate 410). The specific direction of carrier flow and/or current flow can depend on the conductivity types of the elements of the FET 400 (e.g., whether the FET 400 is an n-type FET or a p-type FET).

FIGS. 5A-5H are cross-sectional diagrams illustrating a semiconductor manufacturing process for producing a SiC FET 500 with a hybrid, high-k gate dielectric, according to an implementation. The process flow illustrated in FIGS. 5A-5H can be used to produce the FET device 200 of FIG. 2 and a similar process could also be used to produce the FET device 400 of FIG. 4 (or the FET device 100 of FIG. 1). Conductivity types of the specific elements in FIGS. 5A-5H are not discussed, and the conductivity type of each element will depend on the specific implementation, such as described herein.

Figure 5B:
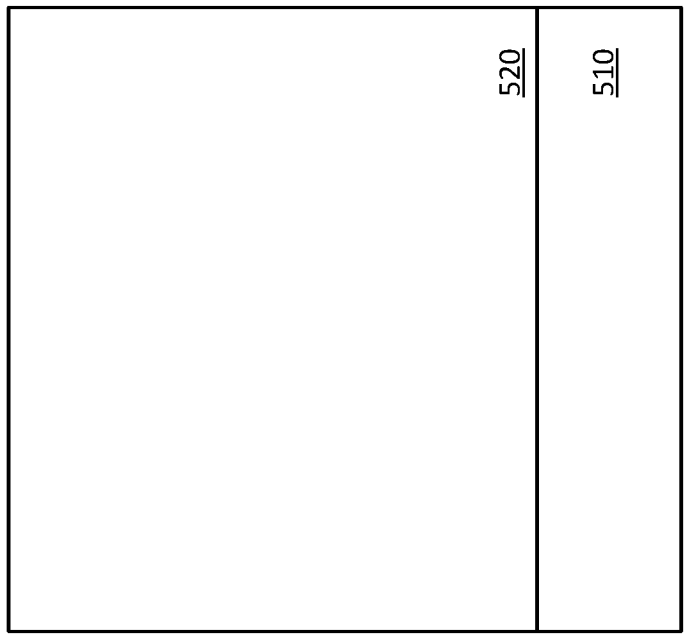
Figure 5A:
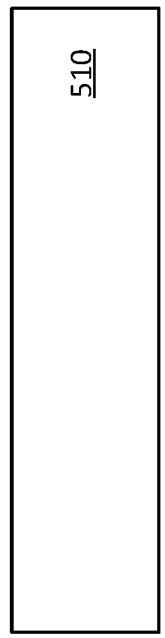
Figure 5D:
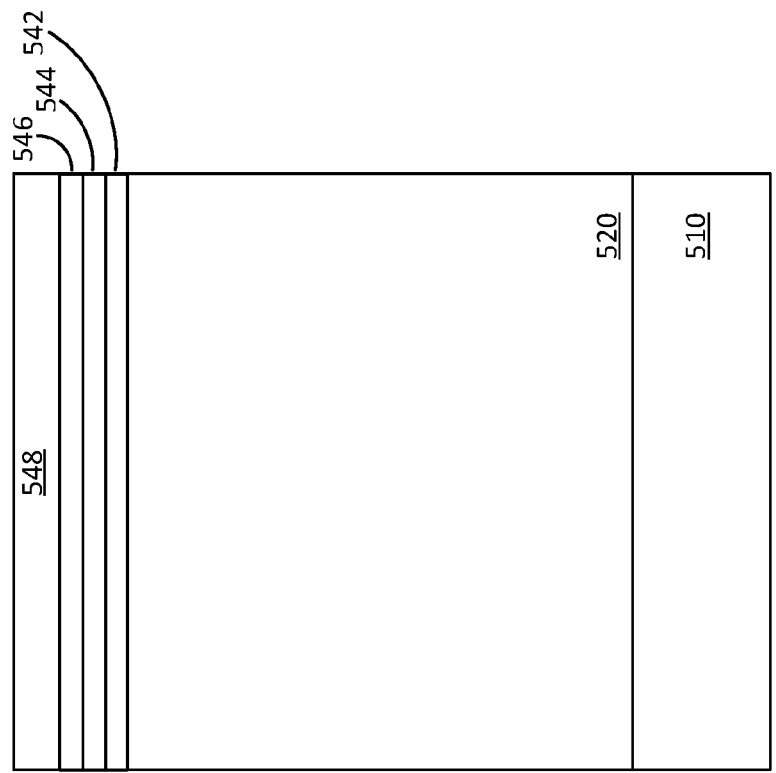
Figure 5C:
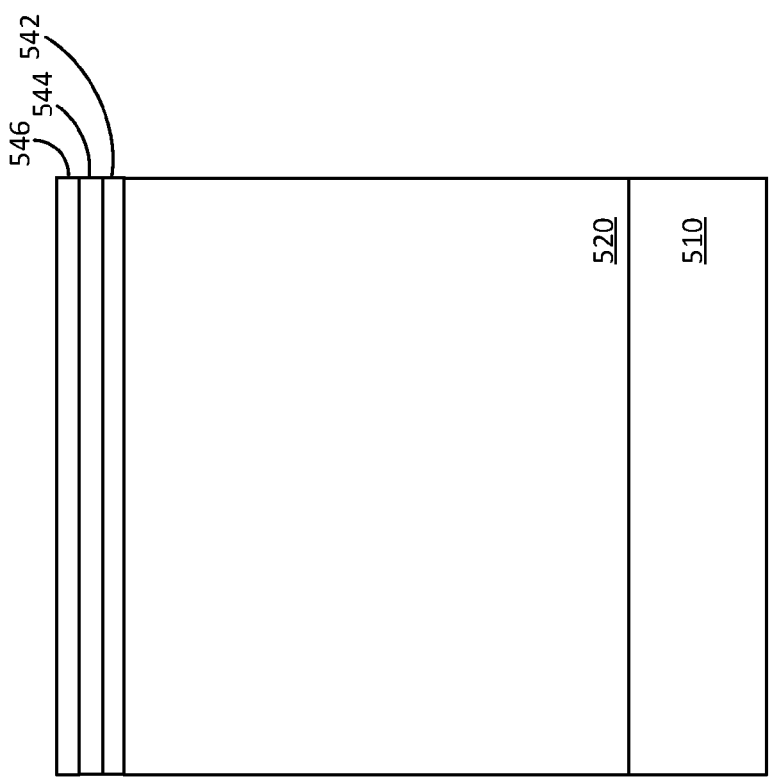

Further, the processing operations illustrated by the manufacturing flow of FIGS. 5A-5H can, where appropriate, be performed in an order other than that shown. For instance, the operation of forming a well region 530 illustrated in FIG. 5G could be performed prior to forming a hybrid, high-k gate dielectric as shown in FIG. 5C. In other implementations, other processing orders are possible. Also, in other implementations, some operations can be omitted, combined and/or replaced. Further, additional processing operations can be performed, as appropriate for the particular implementation. Also, in FIGS. 5A-5H, the elements of the FET 500 are shown for purposes of illustration and may not be shown to scale.

In this example, at FIG. 5A, a highly doped SiC substrate 510 may be provided. As shown in FIG. 5B, a SiC epi-layer 520 can be formed (grown) on the SiC substrate 510. As with the SiC epi-layers of the devices 100, 200 and 400 described above, the SiC epi-layer 520 can have a doping concentration that is less than a doping concentration of the SiC substrate 510. After formation of the SiC epi-layer 520, a clean (e.g., surface clean) operation can be performed on an upper surface of the epi-layer 520. Such a clean operation can include a wet etch process and or a dry etch process. For example, the clean process can include an RCA clean process, a buffered oxide etch, and so forth. Such a clean process can be used to prepare the upper surface of the SiC epi-layer 520 for formation of a hybrid, high-k gate dielectric, such as shown in FIG. 5C. The surface preparation of the SiC epi-layer 520 can also include forming an interfacial layer (not shown), such as a very thin (5-10 Å) layer of high quality, thermally grown $SiO_2$, or other interfacial material, so as to improve the interface quality (reduce a defect density) at the interface between the SiC epi-layer and the hybrid, high-k dielectric of FIG. 5C.

As illustrated in FIG. 5C, a hybrid, high-k gate dielectric that includes a first dielectric layer 542, a second dielectric layer 544 and a third dielectric layer 546 can be formed on the previously prepared surface of the SiC epi-layer 520 (e.g., cleaned with or without forming an interfacial dielectric layer, or other interfacial layer). While FIG. 5C and its subsequent FIGS. 5D-5H have been described as illustrating a tri-layer, hybrid, high-k gate dielectric stack, in other implementations, other arrangements are possible. For example, the hybrid, high-k gate dielectric stack of FIG. 5C could be a bi-layer stack or the gate dielectric could be implemented using a composite, hybrid, high-k gate dielectric, such as those described herein (e.g., with respect to FIG. 3C). In still other implementations, the dielectric layer 542 can be an interfacial dielectric layer (e.g., a thermally grown dielectric layer).

Depending on the particular implementation, any number of approaches can be used to form (e.g., deposit) a hybrid, high-k gate dielectric. In some implementations, a hybrid, high-k gate dielectric can be formed using sputtering and/or chemical-vapor-deposition (CVD) processes. Such CVD process can include metal organic CVD, plasma-enhanced CVD, etc. Hybrid, high-k gate dielectrics, as described herein, can be formed (deposited) at temperatures in a range of 400-900° C.

The hybrid, high-k gate dielectric stack of FIG. 5C (as well as other hybrid, high-k gate dielectric implementations) can be formed "in-situ." Said another way, a hybrid, high-k gate dielectric can be formed using one or more deposition processes that are performed in a single deposition chamber. For instance, the first dielectric layer 542 could be formed using a first deposition process, the second dielectric layer 544 could be formed using a second deposition process and the third dielectric layer 546 could be formed using a third deposition process, with all three deposition processes being performed in the same deposition chamber in sequence (or as a continuous deposition process) without opening the corresponding deposition chamber. Bi-layer hybrid, high-k gate dielectric stacks, or hybrid high-k, dielectric stacks having additional dielectric layers could be similarly formed. Also, a composite hybrid, high-k gate dielectric (such as illustrated in FIG. 3C and described above) could be formed in a single deposition process operation, where material flow rates for each high-k dielectric material of the composite hybrid, high-k gate dielectric are varied during the deposition process, so as to achieve respective desired concentrations of each constituent high-k dielectric material across a thickness of the composite, hybrid, high-k gate dielectric.

For the hybrid gate dielectrics described herein (e.g., with respect to FIGS. 1-6, as noted above, an interfacial dielectric layer can be included, where the interfacial dielectric layer portion that can have a thickness on the order of 5-20 Å. Further, such hybrid gate dielectrics can include a high-k dielectric portion (e.g., a bi-layer, tri-layer, composite, etc.), which can have a thickness on the order of 200-1000 Å that is based on a voltage rating of a corresponding power semiconductor device.

As shown in FIG. 5D, after forming a hybrid, high-k gate dielectric (e.g., as shown in FIG. 5C), a conductive gate electrode layer 548 can be formed. The conductive gate electrode layer 548 can include a polysilicon layer, a metal layer and/or a silicide layer, as some examples. The gate electrode material used in the layer 548 will depend on the particular implementation. In implementations using polysilicon for the conductive gate electrode layer 548, the polysilicon can be doped or undoped when it is deposited on the hybrid, high-k gate dielectric. In the process flow of FIGS. 5A-5H, undoped polysilicon can be used, where such undoped polysilicon may be later doped by the source/drain implant operation of FIG. 5F (and lightly counter-doped by the well implant operation of FIG. 5G). Depending on the particular implementation, the conductive gate electrode layer 548 can have a thickness in a range of 1000 Å-1 μm.

As shown in FIG. 5E, photomask lithography can be used to form an etch mask 570 and a dry (e.g., anisotropic) etch operation (e.g., a reactive ion etch, etc.) 575 can be performed to remove unmasked portions (e.g., not protected by the etch mask 570) of the conductive gate electrode layer 548 and the hybrid, high-k gate dielectric stack (e.g., the first dielectric layer 542, the second dielectric layer 544 and the third dielectric layer 546) to define the gate structure 540 shown in FIG. 5F.

After the etch process 575 of FIG. 5E is completed, the etch mask 570 can be removed and, as shown in FIG. 5F, photolithography processes can be used to form an implant mask 580. As also shown in FIG. 5F, a source/drain implant 585 can be performed to define (form) a source region 550 and a drain region 560 for the device 500. As the mask 580 and the gate structure block the source/drain implant 585, the implant 585 may be referred to a self-aligned, source/drain implant, as the source 550 and the drain 560 are formed in the epi-layer 520 in alignment with the implant mask 580 and the gate structure 540.

Figure 5G:
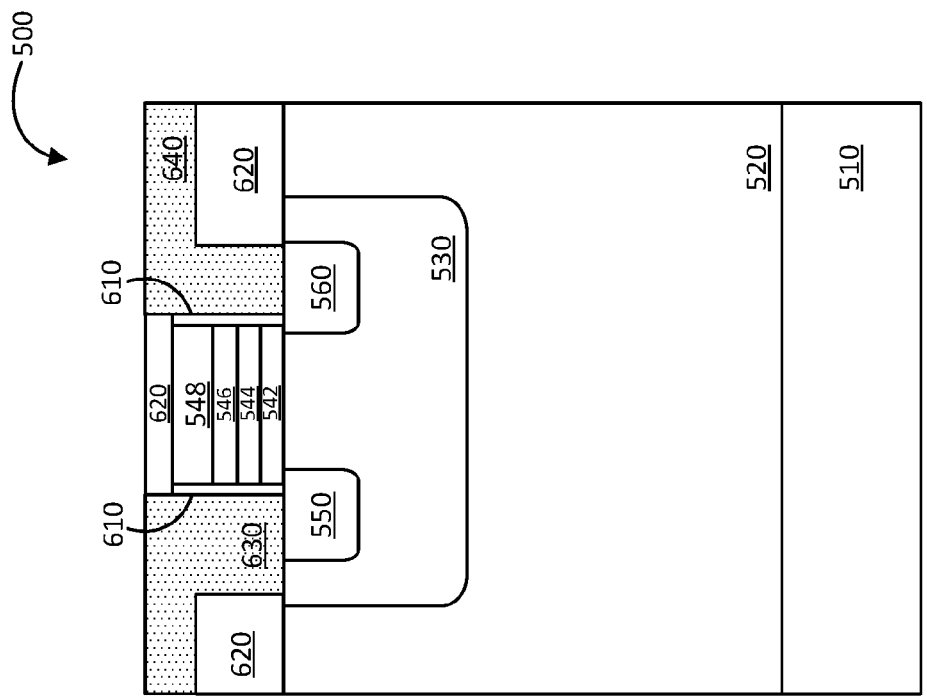

After completion of the source/drain implant 585, the implant mask 580 can be removed and, as illustrated in FIG. 5G, another implant mask 590 can be formed (e.g., using photolithography processes). As shown in FIG. 5G, a well implant 595 (as well as an implant drive operation) can be performed to define (form) a well region 530. In addition to the implant mask 590, the gate structure 540 can also block the well implant 595. As a result, a doping concentration of the well region 530 can vary (laterally) across a width of the well region 530. In other implementations, as was noted above, the well implant process of FIG. 5G could be performed after the epi-layer 520 is grown, as described with respect to FIG. 5B, which can result in a more uniform doping concentration of the well region 530.

Figure 5H:
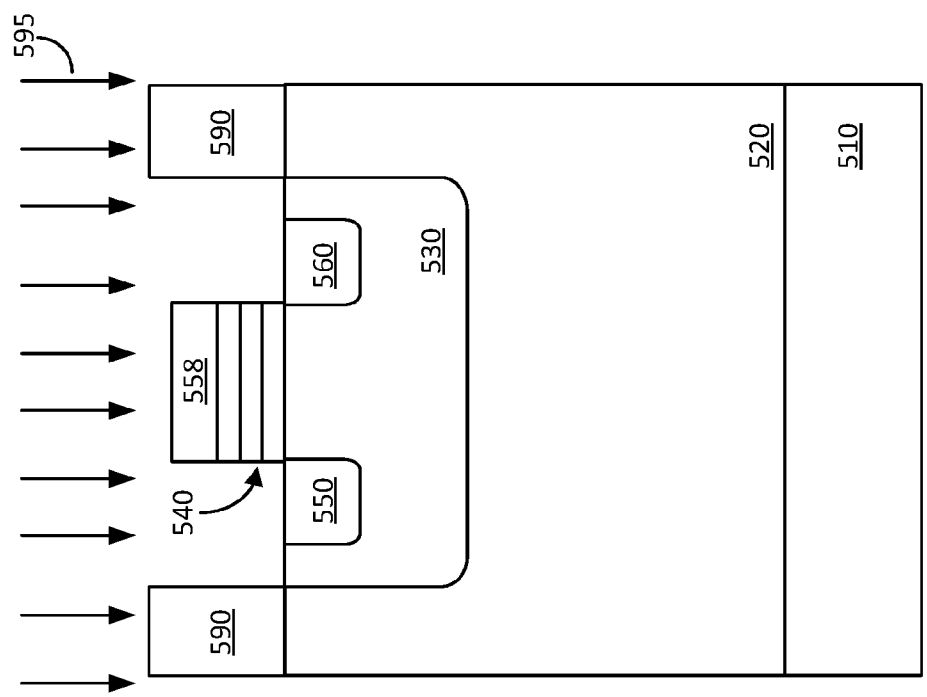

After completion of the well implant 595, the implant mask 590 can be removed and additional semiconductor processing operations can be performed to produce electrical connections to the source 550 and the drain 560, such as shown in FIG. 5H. As discussed above, in certain implementations, a gate runner (not shown) can be used to provide electrical connection (e.g., a gate signal, gate terminal, etc.) to the conductive gate electrode 558. As shown in FIG. 5H, the additional processing operations can be used to produce: spacers 610 on sidewalls of the gate structure 540; a dielectric layer 620 to define contact openings to the well (body) region 530, the source 540 and the drain 560; and a conductive layer. The conductive layer, as shown in FIG. 5H, can form (define) a first electrical contact 630 with the well (body) region 530 and the source 550 of the FET 500, and a second electric contact 640 with the drain 560 of the FET 500.

Figure 6:
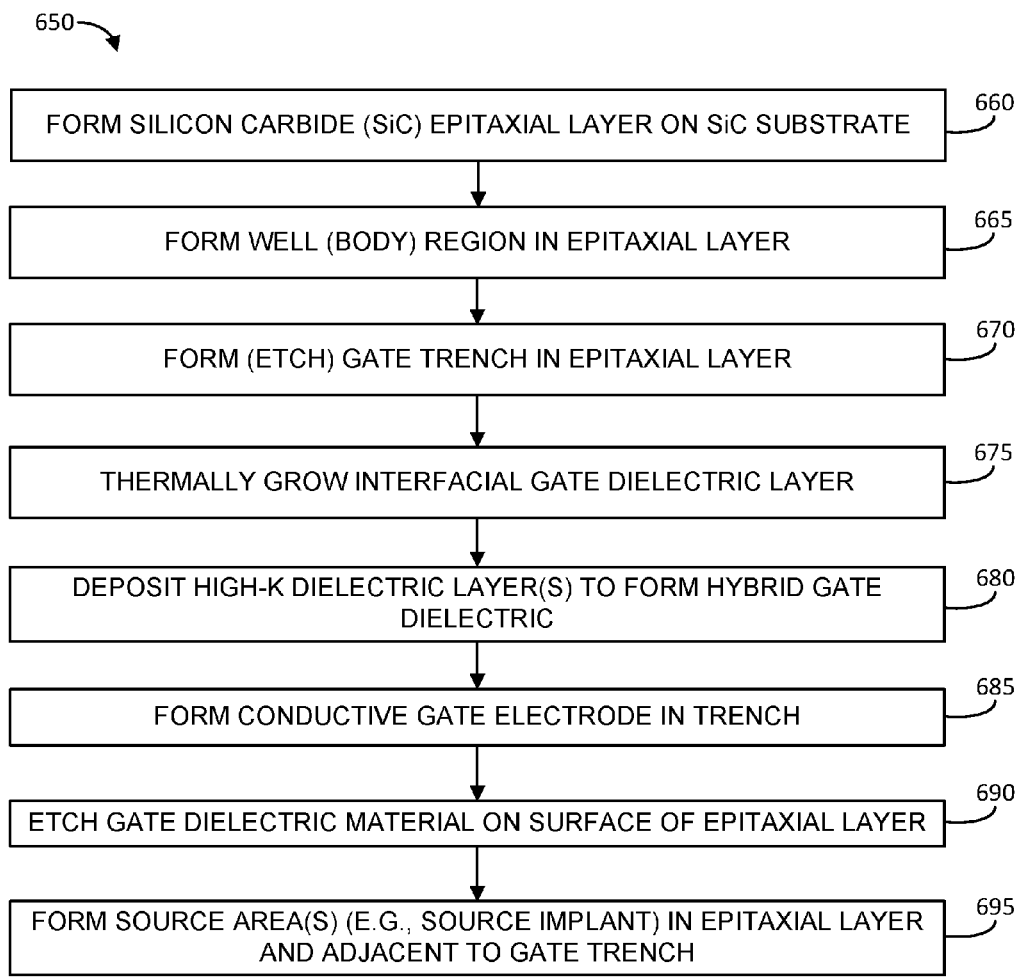
FIG. 6 is a flowchart illustrating a semiconductor manufacturing process for producing a SiC trench gate FET with a hybrid gate dielectric, such as the SiC trench-gate FET shown in FIG. 1, according to an implementation.

FIG. 6 is a flowchart illustrating a semiconductor manufacturing process (method) 650 for producing a SiC trench gate FET with a hybrid gate dielectric, such as the SiC trench-gate FET shown in FIG. 1, according to an implementation. Further, at least some of the operations of the method 650 can be performed in similar fashion as the semiconductor processing operations illustrated and described with respect to FIGS. 5A-5H. For purposes of illustration, the method 650 will be described with further reference to the trench gate FET 100 illustrated in FIG. 1.

The method 650, at block 660, includes forming the SiC epi-layer 120 on the SiC substrate 110. At block 665, the method can include forming the well (body) region 130 of the FET 100. As noted above, the well (body) region 130 can be of an opposite conductivity type than the SiC substrate 110 and the SiC epi-layer 120.

At block 670, the method 650 includes forming (etching) a gate trench (for the gate structure) in the SiC epi-layer 120. The gate trench can be formed using photolithography to form a mask that defines the gate trench opening, and then etching the SiC epi-layer 120 (e.g., using an anisotropic etch) to define (form, etc.) the gate trench. At block 675, the method 650 includes thermally growing an interfacial dielectric layer. Such an interfacial dielectric layer may be, for example, a thermally grown SiO2 layer. In the FET 100 of FIG. 1, the dielectric layer 142 can be an interfacial dielectric layer. The interfacial dielectric layer can be formed both in the gate trench and on an upper surface of the SiC epi-layer 120 (e.g., on an upper surface of the well region 130 that is disposed in the SiC epi-layer 120).

At block 680, the method 650 includes depositing one or more high-k dielectric layers (e.g., on the interfacial dielectric layer in both the gate trench and on the upper surface of the well region 130) to form a hybrid gate dielectric (e.g., in conjunction with the interfacial dielectric layer). As described herein, the one or more high-k dielectric layers can include a bi-layer high-k dielectric layer stack, a tri-layer high-k dielectric stack, composite high-k dielectric layer, and so forth.

At block 685, the method 650 includes forming the conductive gate electrode 148 in the gate trench of the FET 100. In an implementation, forming the conductive gate electrode at block 685 can also include forming the dielectric cap 170 of the FET 100.

At block 690, the method 650 includes etching excess hybrid gate dielectric material, such as etching high-k dielectric material and/or interfacial dielectric material from the upper surface of the well region 130. As with other operations described herein, the etch process of block 690 can include forming an etch mask using one or more photolithography processing operations and one or more etch processing operations. At block 695, the method 650 includes performing an implant to form the source regions 150 of the FET 100.

Also, while not specifically shown in FIG. 6, the method 600 can include further processing operations. For instance, the method 600 could include performing an implant operation to form heavy body regions 160 (e.g., to reduce contact resistance); forming metal interconnect layers to contact the source regions 150, the body region 130 and/or the heavy body regions 160; forming a backside drain contact on the SiC substrate 110, and so forth. The specific semiconductor processing operations performed will depend on the particular device being implemented.

In a general aspect, a power semiconductor device can include a silicon carbide (SiC) substrate of a first conductivity type and a SiC epitaxial layer of the first conductivity type disposed on the SiC substrate. The SiC epitaxial layer can have a doping concentration that is different than a doping concentration of the SiC substrate. The power semiconductor device can also include a well region of a second conductivity type disposed in the SiC epitaxial layer, a source region of the first conductivity type disposed in the well region and a gate trench disposed in the SiC epitaxial layer and adjacent to the source region. The gate trench can have a depth that is greater than a depth of the well region and that is less than a depth of the SiC epitaxial layer. The power semiconductor device can further include a hybrid gate dielectric disposed on a sidewall of the gate trench and a bottom surface of the gate trench. The hybrid gate dielectric can include a first high-k dielectric material and a second high-k dielectric material that is different than the first high-k dielectric material. The power semiconductor device can still further include a conductive gate electrode disposed on the hybrid gate dielectric.

Implementations can include one or more of the following features. For example, the first high-k dielectric material can be included in a first layer of the hybrid gate dielectric that is disposed on the sidewall of the gate trench and the bottom surface of the gate trench. The second high-k dielectric material can be included in a second layer of the hybrid gate dielectric that is disposed on the first layer of the hybrid gate dielectric.

The hybrid gate dielectric can include an interface dielectric layer disposed between at least a portion of the gate trench and the first high-k dielectric material. The interface dielectric layer can include a thermally grown silicon dioxide (SiO$_2$) layer.

The hybrid gate dielectric can include a composite of the first high-k dielectric material and the second high-k dielectric material. Respective concentrations of the first high-k dielectric material and the second high-k dielectric material can vary across a thickness of the hybrid gate dielectric.

The hybrid gate dielectric can include a third high-k dielectric material. The first high-k dielectric material can be included in a first layer of the hybrid gate dielectric that is disposed on the sidewall of the gate trench and the bottom surface of the gate trench. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The first high-k dielectric material and the third high-k dielectric material can be a same high-k dielectric material.

The hybrid gate dielectric can include a third high-k dielectric material, where the hybrid gate dielectric includes a composite of the first high-k dielectric material, the second high-k dielectric material and the third high-k dielectric material. Respective concentrations of the first high-k dielectric material, the second high-k dielectric material and the third high-k dielectric material can vary across a thickness of the hybrid gate dielectric.

The conductive gate electrode can include at least one of doped polysilicon, a metal and a silicide. The power semiconductor device can include a dielectric cap disposed on the conductive gate electrode.

The power semiconductor device can include a heavy body region of the second conductivity type disposed in the well region and adjacent to the source region. The heavy body region can have a doping concentration that is greater than a doping concentration of the well region.

In another general aspect, a power semiconductor device can include a silicon carbide (SiC) substrate of a first conductivity type and a SiC epitaxial layer of the first conductivity type disposed on the SiC substrate. The SiC epitaxial layer can have a doping concentration that is different than a doping concentration of the SiC substrate. The power semiconductor device can also include a well region of a second conductivity type disposed in the SiC epitaxial layer, a source region of the first conductivity type disposed in the well region, a drain region of the first conductivity type disposed in the well region and a gate structure disposed on the SiC epitaxial layer. The gate structure can extend between the source region and the drain region. The gate structure can be disposed on a portion of the source region and a portion of the drain region. The gate structure can include a hybrid gate dielectric disposed on the SiC epitaxial layer. The hybrid gate dielectric can include a first high-k dielectric material and a second high-k dielectric material. The gate structure can further include a conductive gate electrode disposed on the hybrid gate dielectric.

Implementations can include one or more of the following features. For instance, the first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The hybrid gate dielectric can include a composite of the first high-k dielectric material and the second high-k dielectric material.

The hybrid gate dielectric can include a third high-k dielectric material. The first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The hybrid gate dielectric can include a composite of the first high-k dielectric material, the second high-k dielectric material and the third high-k dielectric material.

In another general aspect, a power semiconductor device can include a silicon carbide (SiC) substrate of a first conductivity type. The SiC substrate can include a drain region of the power semiconductor device. The power semiconductor device can also include a SiC epitaxial layer of the first conductivity type disposed on the SiC substrate. The SiC epitaxial layer can have a doping concentration that is different than a doping concentration of the SiC substrate. The power semiconductor device can further include a first well region of a second conductivity type disposed in the SiC epitaxial layer and a second well region of the second conductivity type disposed in the SiC epitaxial layer. The power semiconductor device can also further include a first source region of the first conductivity type disposed in the first well region and a second source region of the first conductivity type disposed in the second well region. The power semiconductor device can still further include a gate structure disposed on the SiC epitaxial layer. The gate structure can extend between the first source region and the second region. The gate structure can be disposed on a portion of the first source region and a portion of the first source region. The gate structure can include a hybrid gate dielectric disposed on the SiC epitaxial layer. The hybrid gate dielectric can further include a first high-k dielectric material and a second high-k dielectric material. The gate structure can still further include a conductive gate electrode disposed on the hybrid gate dielectric.

Implementations can include one or more of the following features. For instance, the first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The hybrid gate dielectric can include a composite of the first high-k dielectric material and the second high-k dielectric material.

The hybrid gate dielectric can include a third high-k dielectric material. The first high-k dielectric material can be included in a first layer of the hybrid gate dielectric that is disposed on the SiC epitaxial layer. The second high-k dielectric material can be included in a second layer of the hybrid gate dielectric that is disposed on the first layer of the hybrid gate dielectric. The third high-k dielectric material can be included in a third layer of the hybrid gate dielectric that is disposed on the second layer of the hybrid gate dielectric. The hybrid gate dielectric can include a composite of the first high-k dielectric material, the second high-k dielectric material and the third high-k dielectric material.

The various apparatus and techniques described herein may be implemented using various semiconductor processing and/or packaging techniques. Some embodiments may be implemented using various types of semiconductor processing techniques.

While certain features of the described implementations have been illustrated as described herein, many modifications, substitutions, changes and equivalents will now occur to those skilled in the art. It is, therefore, to be understood that claims, when appended, are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A power semiconductor device comprising:
   a silicon carbide (SiC) substrate of a first conductivity type, the SiC substrate including a drain region of the power semiconductor device;
   a SiC epitaxial layer of the first conductivity type disposed on the SiC substrate, the SiC epitaxial layer having a doping concentration that is different than a doping concentration of the SiC substrate;
   a first well region of a second conductivity type disposed in the SiC epitaxial layer;
   a second well region of the second conductivity type disposed in the SiC epitaxial layer;
   a first source region of the first conductivity type disposed in the first well region;
   a second source region of the first conductivity type disposed in the second well region;
   a gate structure disposed on the SiC epitaxial layer, the gate structure extending between the first source region and the second region, the gate structure being disposed on a portion of the first source region and a portion of the second source region, the gate structure including:
     a hybrid gate dielectric including a first high-k dielectric material and a second high-k dielectric material;
     an interface dielectric layer disposed between the hybrid gate dielectric and the SiC epitaxial layer, the interface dielectric layer including a thermally grown silicon dioxide ($SiO_2$) layer that fully separates the hybrid gate dielectric from the SiC epitaxial layer; and
     a conductive gate electrode disposed on the hybrid gate dielectric.

2. The power semiconductor device of claim 1, wherein:
   the first high-k dielectric material is included in a first layer of the hybrid gate dielectric that is disposed on the SiC epitaxial layer; and
   the second high-k dielectric material is included in a second layer of the hybrid gate dielectric that is disposed on the first layer of the hybrid gate dielectric.

3. The power semiconductor device of claim 1, wherein the hybrid gate dielectric includes a composite of the first high-k dielectric material and the second high-k dielectric material.

4. The power semiconductor device of claim 3, wherein respective concentrations of the first high-k dielectric material and the second high-k dielectric material vary across a thickness of the hybrid gate dielectric.

5. The power semiconductor device of claim 1, where the hybrid gate dielectric further includes a third high-k dielectric material.

6. The power semiconductor device of claim 5, wherein:
   the first high-k dielectric material is included in a first layer of the hybrid gate dielectric that is disposed on the SiC epitaxial layer;
   the second high-k dielectric material is included in a second layer of the hybrid gate dielectric that is disposed on the first layer of the hybrid gate dielectric; and
   the third high-k dielectric material is included in a third layer of the hybrid gate dielectric that is disposed on the second layer of the hybrid gate dielectric.

7. The power semiconductor device of claim 6, wherein the first high-k dielectric material and the third high-k dielectric material are a same high-k dielectric material.

8. The power semiconductor device of claim 1, wherein the hybrid gate dielectric further includes a third high-k dielectric material, the hybrid gate dielectric including a composite of the first high-k dielectric material, the second high-k dielectric material and the third high-k dielectric material.

9. The power semiconductor device of claim 8, wherein respective concentrations of the first high-k dielectric material, the second high-k dielectric material and the third high-k dielectric material vary across a thickness of the hybrid gate dielectric.

10. The power semiconductor device of claim 1, wherein the conductive gate electrode includes at least one of doped polysilicon, a metal and a silicide.

11. The power semiconductor device of claim 1, wherein the gate structure further includes a dielectric cap disposed on the conductive gate electrode.

12. A power semiconductor device comprising:
    a silicon carbide (SiC) semiconductor layer of a first conductivity type;
    a first well region of a second conductivity type disposed in the SiC semiconductor layer;
    a second well region of the second conductivity type disposed in the SiC semiconductor layer;
    a first source region of the first conductivity type disposed in the first well region;
    a second source region of the first conductivity type disposed in the second well region;
    a gate structure disposed on the SiC semiconductor layer, the gate structure including:
      an interface dielectric layer disposed on the SiC semiconductor layer, the interface dielectric layer including a thermally grown silicon dioxide ($SiO_2$) layer, the interface dielectric layer extending between the first source region and the second region, the interface dielectric layer being disposed on a portion of the first source region and a portion of the first source region; and a hybrid gate dielectric disposed on the interface dielectric layer, the hybrid gate dielectric including a first high-k dielectric material and a second high-k dielectric material, the hybrid gate dielectric being separated from the SiC semiconductor layer by the interface dielectric layer along an entirety of the hybrid gate dielectric.

13. The power semiconductor device of claim 12, further comprising a conductive gate electrode disposed on the hybrid gate dielectric.

14. The power semiconductor device of claim 13, wherein the conductive gate electrode includes at least one of doped polysilicon, a metal and a silicide.

15. The power semiconductor device of claim 13, further comprising a dielectric cap disposed on the conductive gate electrode.

16. The power semiconductor device of claim 12, wherein:
the first high-k dielectric material is included in a first layer of the hybrid gate dielectric that is disposed on the SiC semiconductor layer; and
the second high-k dielectric material is included in a second layer of the hybrid gate dielectric that is disposed on the first layer of the hybrid gate dielectric.

17. The power semiconductor device of claim 12, wherein the hybrid gate dielectric includes a composite of the first high-k dielectric material and the second high-k dielectric material.

18. The power semiconductor device of claim 17, wherein respective concentrations of the first high-k dielectric material and the second high-k dielectric material vary across a thickness of the hybrid gate dielectric.

19. The power semiconductor device of claim 12, where the hybrid gate dielectric further includes a third high-k dielectric material.

20. The power semiconductor device of claim 19, wherein:
the first high-k dielectric material is included in a first layer of the hybrid gate dielectric that is disposed on the SiC semiconductor layer;
the second high-k dielectric material is included in a second layer of the hybrid gate dielectric that is disposed on the first layer of the hybrid gate dielectric; and
the third high-k dielectric material is included in a third layer of the hybrid gate dielectric that is disposed on the second layer of the hybrid gate dielectric.

21. The power semiconductor device of claim 20, wherein the first high-k dielectric material and the third high-k dielectric material are a same high-k dielectric material.

22. The power semiconductor device of claim 12, wherein the hybrid gate dielectric further includes a third high-k dielectric material, the hybrid gate dielectric includes a composite of the first high-k dielectric material, the second high-k dielectric material and the third high-k dielectric material.

23. The power semiconductor device of claim 22, wherein respective concentrations of the first high-k dielectric material, the second high-k dielectric material and the third high-k dielectric material vary across a thickness of the hybrid gate dielectric.

24. A power semiconductor device comprising:
a silicon carbide (SiC) substrate of a first conductivity type, the SiC substrate including a drain region of the power semiconductor device;
a SiC epitaxial layer of the first conductivity type disposed on the SiC substrate, the SiC epitaxial layer having a doping concentration that is different than a doping concentration of the SiC substrate;
a first well region of a second conductivity type disposed in the SiC epitaxial layer;
a second well region of the second conductivity type disposed in the SiC epitaxial layer;
a first source region of the first conductivity type disposed in the first well region;
a second source region of the first conductivity type disposed in the second well region;
a gate structure disposed on the SiC epitaxial layer, the gate structure extending between the first source region and the second region, the gate structure being disposed on a portion of the first source region and a portion of the second source region, the gate structure including:
a hybrid gate dielectric including a first high-k dielectric material and a second high-k dielectric material;
an interface dielectric layer disposed between the hybrid gate dielectric and the SiC epitaxial layer, such that the hybrid gate dielectric does not contact the SiC epitaxial, the interface dielectric layer including a thermally grown silicon dioxide ($SiO_2$); and
a conductive gate electrode disposed on the hybrid gate dielectric.

* * * * *